United States Patent
Suzuki et al.

(10) Patent No.: US 10,048,124 B2
(45) Date of Patent: Aug. 14, 2018

(54) OPTICAL RECEIVING CIRCUIT AND METHOD FOR MANUFACTURING THE SAME

(71) Applicant: Photonics Electronics Technology Research Association, Tokyo (JP)

(72) Inventors: Yasuyuki Suzuki, Tokyo (JP); Daisuke Okamoto, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 136 days.

(21) Appl. No.: 15/023,354

(22) PCT Filed: Oct. 1, 2014

(86) PCT No.: PCT/JP2014/076307
§ 371 (c)(1),
(2) Date: Mar. 18, 2016

(87) PCT Pub. No.: WO2015/050168
PCT Pub. Date: Apr. 9, 2015

(65) Prior Publication Data
US 2016/0245691 A1    Aug. 25, 2016

(30) Foreign Application Priority Data

Oct. 2, 2013    (JP) ................. 2013-206967

(51) Int. Cl.
*H03F 3/08* (2006.01)
*G01J 1/44* (2006.01)
(Continued)

(52) U.S. Cl.
CPC .......... *G01J 1/44* (2013.01); *H01L 21/02164* (2013.01); *H01L 21/768* (2013.01);
(Continued)

(58) Field of Classification Search
CPC ................................. H03F 3/087; H03F 1/08
See application file for complete search history.

(56) References Cited

U.S. PATENT DOCUMENTS

2005/0025498 A1    2/2005  Ono et al.
2012/0170944 A1    7/2012  Yagisawa et al.
(Continued)

FOREIGN PATENT DOCUMENTS

JP    H10-290014 A    10/1998
JP    2003-124884 A    4/2003
(Continued)

OTHER PUBLICATIONS

International Search Report issued in Application No. PCT/JP2014/076307, dated Nov. 18, 2014.
Extended Search Report issued in European Application No. 14850881.5, dated Jul. 31, 2017.
Office Action issued in Japanese Application No. 2015-540526, dated Jun. 25, 2018.

*Primary Examiner* — Thanh Luu
(74) *Attorney, Agent, or Firm* — Michael Best & Friedrich LLP

(57) ABSTRACT

An optical receiving circuit which suppresses a characteristic deterioration due to a wiring between a PD and a TIA and a method for manufacturing the optical receiving circuit are provided. A optical receiving circuit (300) comprises a photodiode (302), and a transimpedance amplifier (308) that supplies an electrical power source to the photodiode (302). The characteristic impedance of a wiring between the anode of the photodiode (302) and the transimpedance amplifier (308) is higher than the characteristic impedance of a wiring between the cathode of the photodiode (302) and the transimpedance amplifier (308).

10 Claims, 11 Drawing Sheets

(51) Int. Cl.
  *H04B 10/60* (2013.01)
  *H01L 21/02* (2006.01)
  *H01L 21/768* (2006.01)
  *H01L 27/144* (2006.01)
  *H01L 31/02* (2006.01)
  *H01L 31/028* (2006.01)
  *H01L 31/18* (2006.01)
  *H03F 1/08* (2006.01)

(52) U.S. Cl.
  CPC .... *H01L 27/1443* (2013.01); *H01L 31/02005* (2013.01); *H01L 31/028* (2013.01); *H01L 31/1808* (2013.01); *H03F 1/083* (2013.01); *H03F 3/08* (2013.01); *H04B 10/60* (2013.01); *G01J 2001/446* (2013.01)

(56) References Cited

U.S. PATENT DOCUMENTS

| | | | | |
|---|---|---|---|---|
| 2012/0241599 | A1* | 9/2012 | Uemura | H04B 10/69 250/214.1 |
| 2014/0097331 | A1* | 4/2014 | Tsunoda | H03F 3/08 250/214 A |
| 2015/0069220 | A1 | 3/2015 | Yagisawa | |

FOREIGN PATENT DOCUMENTS

| | | |
|---|---|---|
| JP | 2012-142822 A | 7/2012 |
| JP | 2012-244293 A | 12/2012 |
| JP | 2015-056704 A | 3/2015 |
| WO | WO-2010/028355 A1 | 3/2010 |

* cited by examiner (A)

(B)

OPTICAL RECEIVING CIRCUIT AND METHOD FOR MANUFACTURING THE SAME

TECHNICAL FIELD

The present invention relates to an optical receiving circuit and a method for manufacturing the circuit, and, more specifically, to an optical receiving circuit that suppresses characteristic deterioration due to a wiring between a photodiode and a transimpedance amplifier (TIA) and a method for manufacturing the circuit.

BACKGROUND ART

In a receiver in an optical communication system, a photodiode (PD) converts an optical signal into a current signal. In addition, a transimpedance amplifier (TIA) connected to the PD converts the current signal into a voltage signal and amplifies it, and sends the signal to a next stage.

Conventionally, when constructing such an optical receiving circuit, an anode of a PD and a TIA are connected by wire bonding, and a cathode of the PD is grounded via a chip capacitor. There are several methods for supplying an electrical power to a PD, such as a method for separately supplying an electrical power to each of a PD and a TIA and a method for supplying an electrical power from a TIA to a PD. For reducing the number of electrical power sources and/or the number of electrical power source pads, it is desirable to supply an electrical power from a TIA to a PD.

In such an optical receiving circuit, a wiring for connecting a PD and a TIA has a large effect on a characteristic of the optical receiving circuit and, as a result, an eye pattern of a voltage signal outputted from the TIA may be deteriorated.

SUMMARY OF INVENTION

Technical Problem

Embodiments of the present invention provide an optical receiving circuit that suppresses characteristic deterioration due to a wiring between a PD and a TIA and a method for manufacturing the circuit.

Solution to Problems

In an embodiment of the present invention, an optical receiving circuit comprises a photodiode and a transimpedance amplifier configured to supply an electrical power to the photodiode. A characteristic impedance of a wiring between an anode of the photodiode and the transimpedance amplifier is higher than a characteristic impedance of a wiring between a cathode of the photodiode and the transimpedance amplifier.

In an embodiment, the characteristic impedance of the wiring between the anode of the photodiode and the transimpedance amplifier is higher than an input impedance of the transimpedance amplifier.

In an embodiment, the characteristic impedance of the wiring between the cathode of the photodiode and the transimpedance amplifier is lower than the input impedance of the transimpedance amplifier.

In an embodiment, a ground is placed in a lower layer of the wiring between the cathode of the photodiode and the transimpedance amplifier, and no ground is placed in a lower layer of the wiring between the anode of the photodiode and the transimpedance amplifier.

In an embodiment, the photodiode and the transimpedance amplifier are formed on an Si substrate.

In an embodiment, the ground placed in the lower layer of the wiring between the cathode of the photodiode and the transimpedance amplifier is formed by an Si layer.

In an embodiment, the photodiode and the transimpedance amplifier are formed on an SOI substrate, wherein the SOI substrate comprises an $SiO_2$ layer interposed between an Si substrate and a surface Si layer.

In an embodiment, the ground placed in the lower layer of the wiring between the cathode of the photodiode and the transimpedance amplifier is formed by an SOI layer.

In an embodiment, a part of the SOI layer corresponding to the wiring between the cathode of the photodiode and the transimpedance amplifier is selectively ion implanted.

In an embodiment, a method for manufacturing an optical receiving circuit comprising a photodiode and a transimpedance amplifier comprises: etching a part of an SOI layer where a wiring between an anode of the photodiode and the transimpedance amplifier is to be formed; ion-implanting a part on the SOI layer where a wiring between the cathode of the photodiode and the transimpedance amplifier is to be formed; forming an $SiO_2$ layer; and forming, on the $SiO_2$ layer, the wiring between the anode of the photodiode and the transimpedance amplifier.

In an embodiment, ion-implanting comprises carrying out carrier injection for forming an Si modulator or a Ge photodetector.

DESCRIPTION OF EMBODIMENTS

Embodiments of the present invention will be explained below with reference to the figures.

According to an embodiment of the present invention, a PD is formed on a substrate and a TIA is flip-chip mounted on the substrate, to thereby form an optical receiving circuit comprising the PD and the TIA on the substrate. The number of necessary members can be reduced and the degree of integration can be increased by the above construction, compared with a prior-art optical receiving circuit. However, wirings between an anode and a cathode of the PD and the TIA, that have lengths of some extent, are required; and the wirings have a large effect on a characteristic of the optical receiving circuit.

Figure 1:
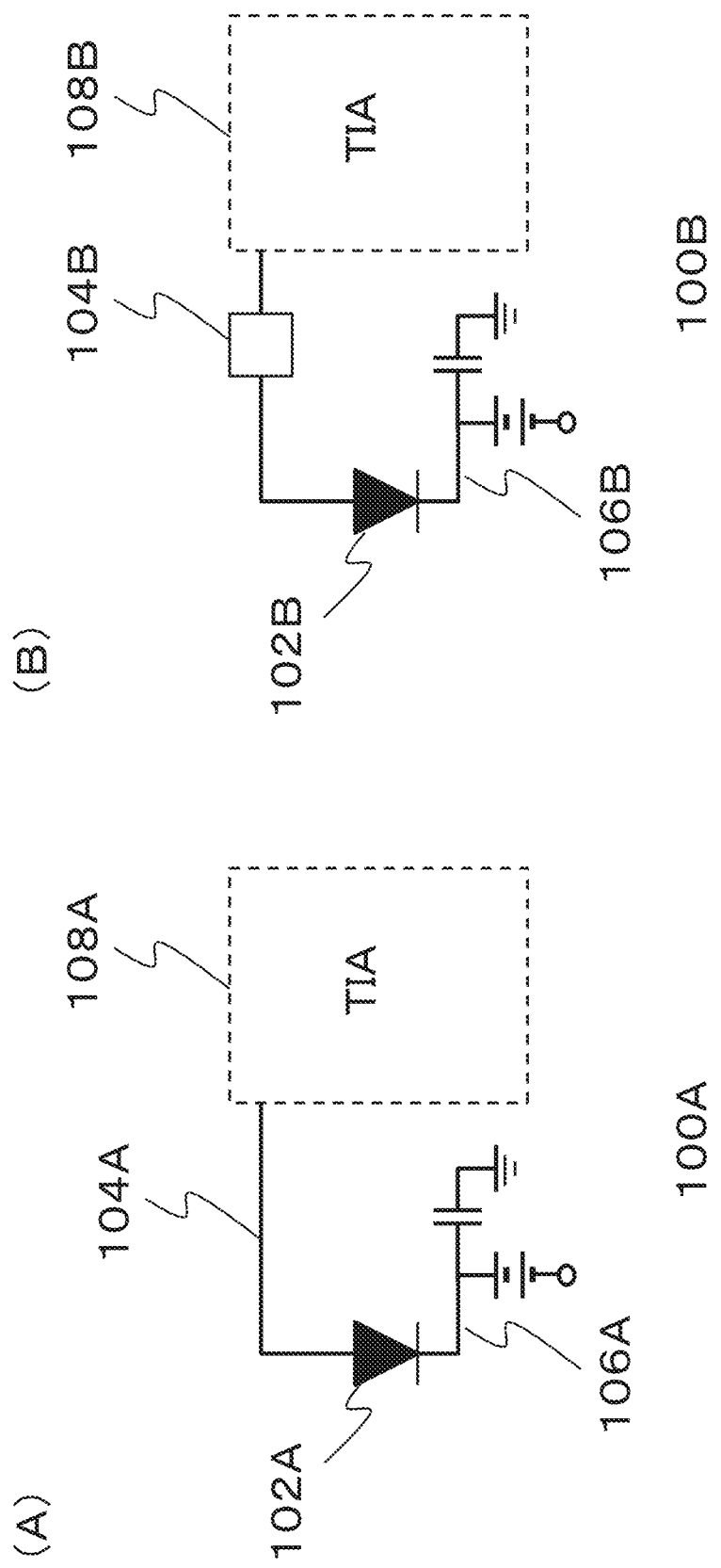
FIG. 1 is a schematic view of an optical receiving circuit.

The inventors of the present invention discovered that, when an optical receiving circuit is formed on a substrate as explained above, characteristic deterioration of the optical receiving circuit can be suppressed by making a characteristic impedance of a wiring, that connects an anode of a PD and a TIA, to be high. FIG. 1(A) and FIG. 1(B) are schematic drawings that show an example optical receiving circuit 100A that does not comprise the above characteristic and an example optical receiving circuit 100B that comprises the above characteristic, respectively. Each of the optical receiving circuits 100A and 100B may be formed on a substrate. The optical receiving circuits 100A and 100B comprise photodiodes (PDs) 102A and 102B, transimpedance amplifiers (TIAs) 108A and 108B, wirings 104A and 104B between anodes of the PDs and the TIAs, and wirings 106A and 106B between cathodes of the PDs and the TIAs, respectively. In FIG. 1, for clearly explaining improvement of the characteristic of the optical receiving circuit according to the present invention, it is supposed that the cathode of the PD is connected to an electrical power source and a capacitor, is grounded in terms of high frequency, and the effect by the cathode-side wiring 106 can be ignored.

As an example, the optical receiving circuit 100A shown in FIG. 1 (A) is configured in such a manner that the anode of the PD 102A and the TIA 108A are connected by the electrical wiring 104A having a width of 50 μm and a length of 500 μm, for example. For example, the electrical wiring 104A may be configured to have a characteristic impedance lower than a characteristic impedance of the TIA 108A. On the other hand, the optical receiving circuit 100B shown in FIG. 1 (B) is configured in such a manner that the anode of the PD 102B and the TIA 108B are connected by an electrical wiring having a width of 10 μm, that is narrower than the above, and a length of 500 μm. Thus, in the optical receiving circuit 100B shown in FIG. 1 (B), the characteristic impedance of the wiring 104B between the anode of the PD 102B and the TIA 108B is high, compared with that in the usual configuration shown in FIG. 1 (A).

Figure 2:
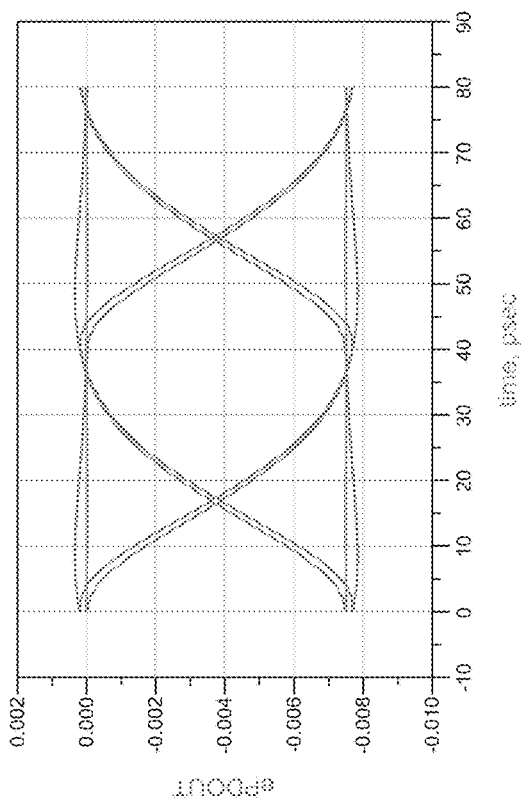
FIG. 2 shows voltage signals outputted from TIAs in the optical receiving circuits shown in FIG. 1.
Figure 2:
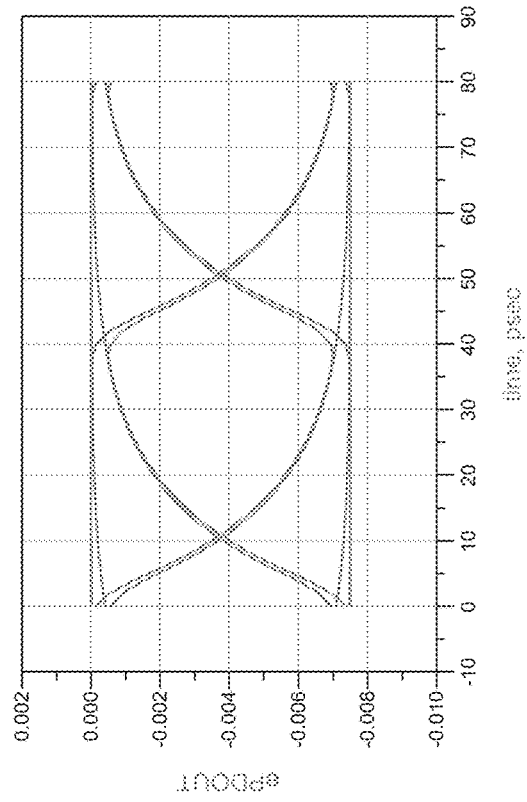

It is supposed that an electrical signal outputted from each of the PDs 102A and 102B is an NRZ signal of 25 Gbps; and results of calculation of voltage signals outputted from the TIAs 108A and 108B, under the above supposition, are shown in FIG. 2 (A) and FIG. 2 (B), respectively. FIG. 2 (A) corresponds to FIG. 1 (A), and FIG. 2 (B) corresponds to FIG. 1 (B). As is evident from FIG. 2, by making the impedance of the wiring between the anode of the PD and the TIA to be high as shown in FIG. 1 (B), the eye opening with respect to the output of the TIA becomes large and, thus, the characteristic of the optical receiving circuit is improved.

Figure 3:
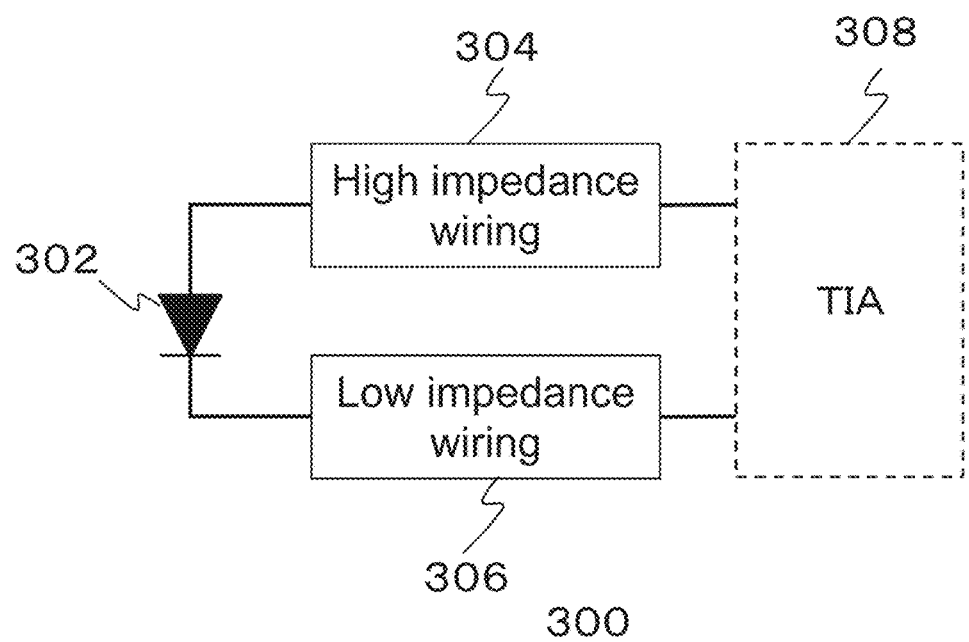
FIG. 3 is a schematic view of an optical receiving circuit according to an embodiment of the present invention.

FIG. 3 is a schematic view of an optical receiving circuit 300 according to an embodiment of the present invention. The optical receiving circuit 300 comprises a PD 302, an anode-side wiring 304, a cathode-side wiring 306, and a TIA 308. The PD 302 and the TIA 308 are connected via the anode-side wiring 304 and the cathode-side wiring 306. An electrical power source for the PD 302 is provided via the TIA 308. In the embodiment, a characteristic impedance of the anode-side wiring 304 is higher than a characteristic impedance of the cathode-side wiring 306. As an example, the characteristic impedance of the anode-side wiring 304 is higher than an input impedance of the TIA 308. Also, as an example, the characteristic impedance of the cathode-side wiring 306 is lower than an input impedance of the TIA 308.

Figure 4:
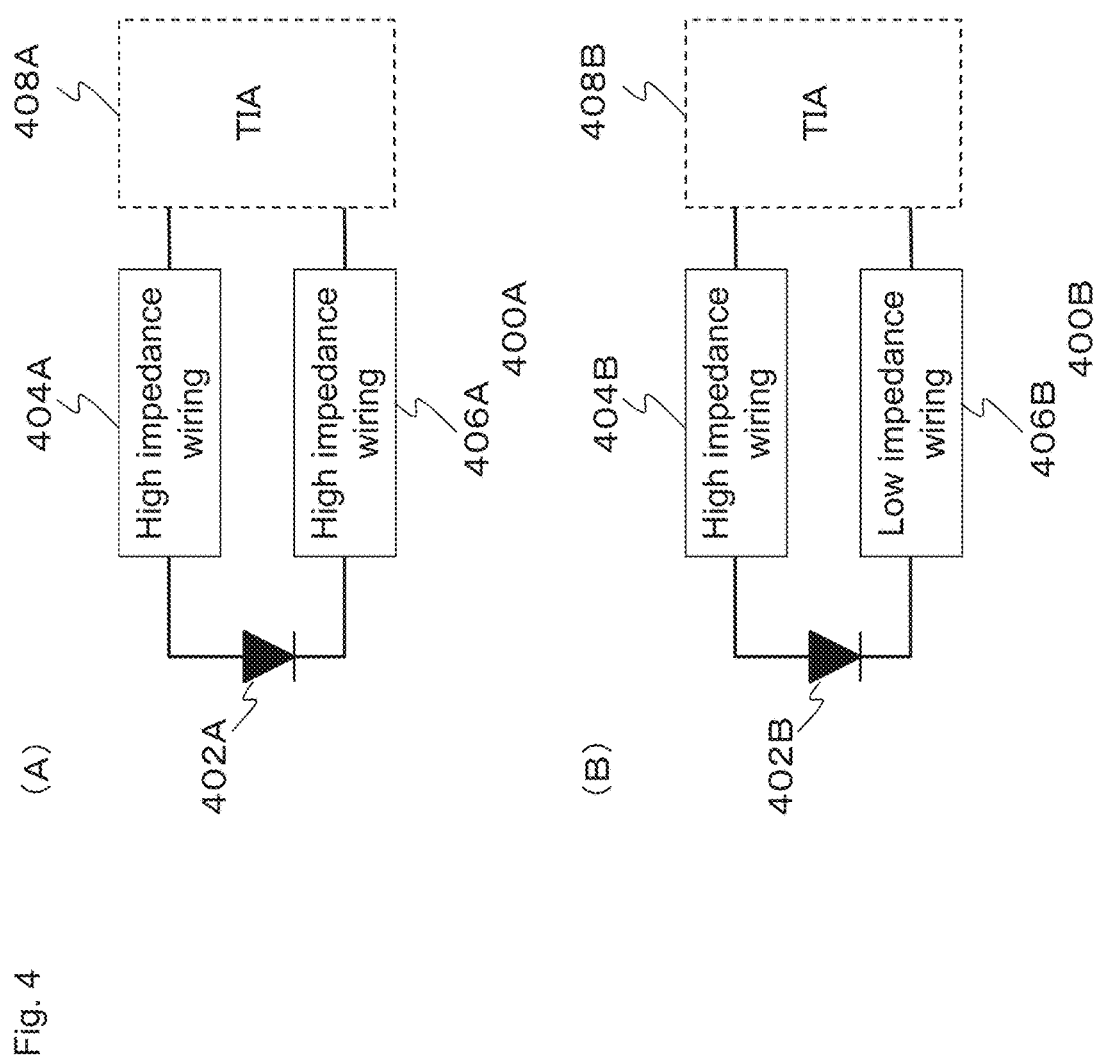
FIG. 4 is a schematic view of optical receiving circuits.
Figure 5:
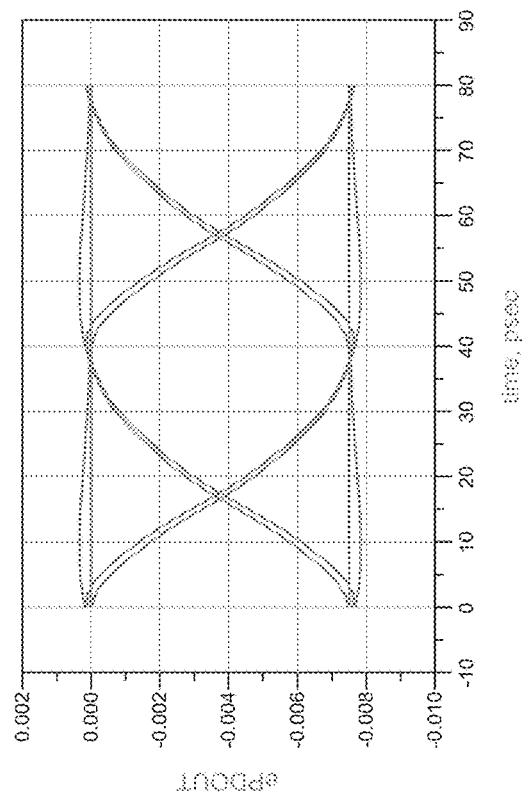
FIG. 5 shows voltage signals outputted from TIAs in the optical receiving circuits shown in FIG. 4.
Figure 5:
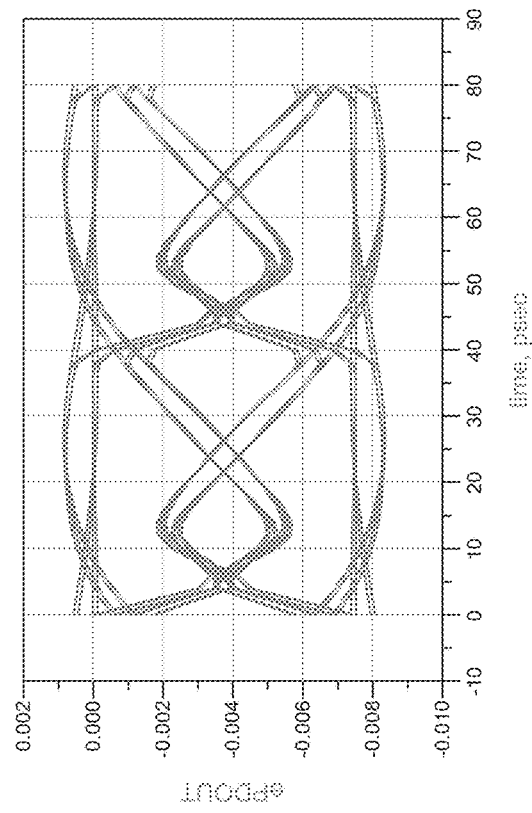

FIG. 4 and FIG. 5 are those for clarifying the effect of the embodiment of the present invention. For comparing with the embodiment of the present invention, FIG. 4 (A) shows an optical receiving circuit 400A that comprises an anode-side wiring 404A and a cathode-side wiring 406A of a PD 402A, wherein both of the anode-side wiring 404A and the cathode-side wiring 406A have high characteristic impedances. FIG. 4 (B) shows an optical receiving circuit 400B according to the embodiment of the present invention. The anode-side wiring 404B of a PD 402B has a high characteristic impedance, and the cathode-side wiring 406B has a low characteristic impedance. As an example, each of the anode-side wiring 404A and the cathode-side wiring 406A in FIG. 4 (A) and the anode-side wiring 404B in FIG. 4 (B) may be configured as an electrical wiring having a height of 1 μm, a width of 10 μm, and a length of 500 μm. The cathode-side wiring 406B in FIG. 4 (B) may be configured to have a height of 1 μm, a width of 90 μm, and a length of 500 μm. That is, in the optical receiving circuit 400B according to the embodiment of the present invention, an inductance component is added in the anode-side wiring 404B, whereas an inductance component is reduced in the cathode-side wiring 406B.

FIG. 5 (A) and FIG. 5 (B) show eye patterns of voltage signals outputted from the TIAs 408A and 408B in the optical receiving circuits shown in FIG. 4 (A) and FIG. 4 (B), respectively, in the case that it is supposed that a current signal outputted from each of the PD 402A and 402B is an NRZ signal of 25 Gbps. It is recognized that a good eye pattern, that expresses that the jitter in the output signal is small and the rise time and the fall time are short, is obtained when the optical receiving circuit 400B according to the embodiment of the present invention is used.

In the embodiment, the anode-side wiring 404B has a characteristic impedance higher than an input impedance of the TIA 408B. Also, in the embodiment, the cathode-side wiring 406B has a characteristic impedance lower than the input impedance of the TIA 408B. In the embodiment of the present invention, the wiring length of the anode-side wiring 404B may be longer than that of the cathode-side wiring 406B. Also, the width of the anode-side wiring 404B may be narrower than that of the cathode-side wiring 406B.

Figure 6:
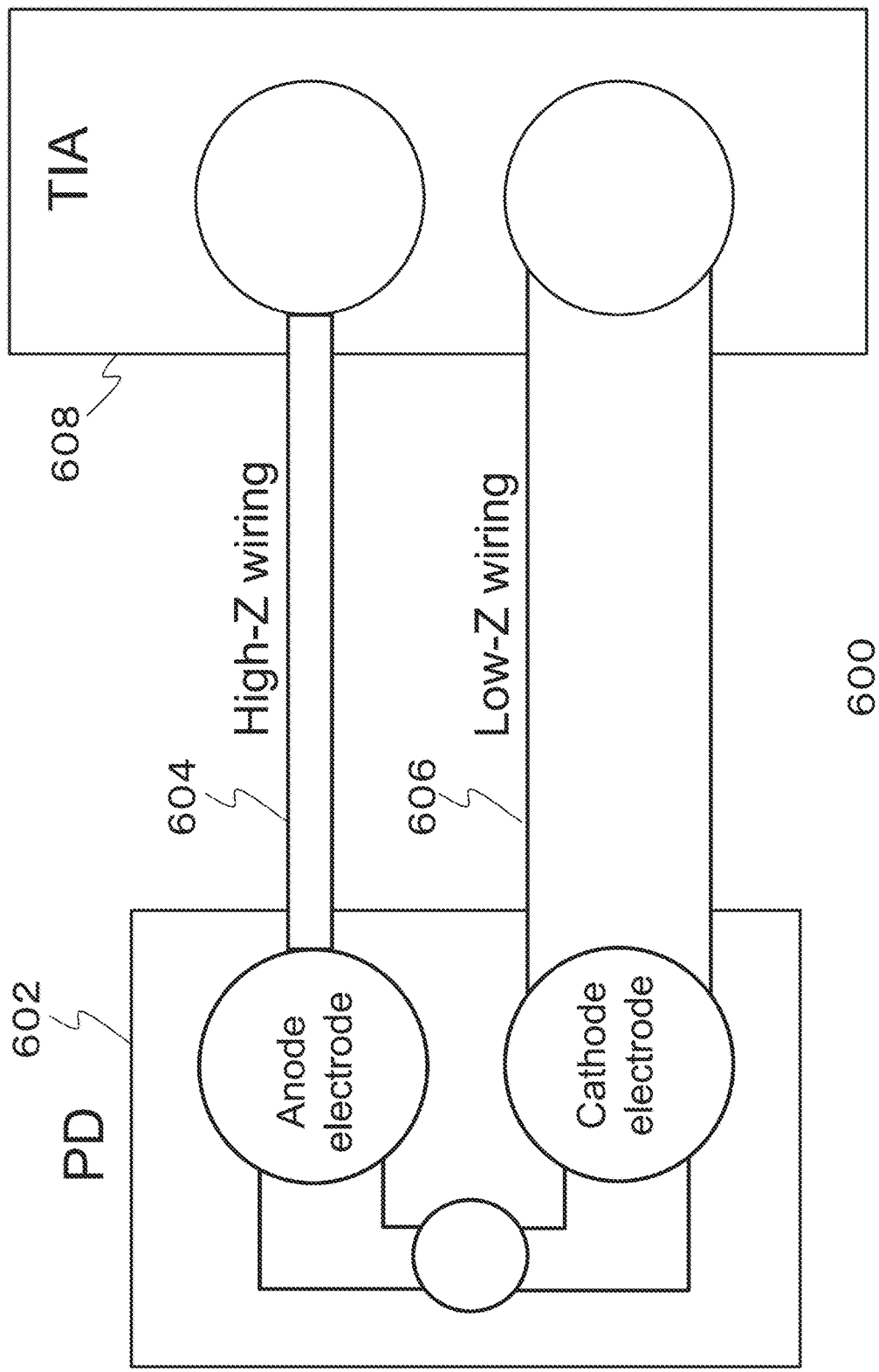
FIG. 6 is a schematic top view of an optical receiving circuit according to an embodiment of the present invention.

FIG. 6 is a schematic top view of an optical receiving circuit 600, that is configured as an optical integrated circuit, according to an embodiment of the present invention. The optical receiving circuit 600 may be configured in such a manner that a substrate is formed by using silicon (Si), and a PD 602 and a TIA 608 are formed on the Si substrate. In the embodiment, the PD 602 and the TIA 608 are connected via an anode-side wiring 604 having a high characteristic impedance and a cathode-side wiring 606 having a low characteristic impedance. For example, the width of the anode-side wiring 604 may be narrower than that of the cathode-side wiring 606.

In this example, the wirings are defined to be those for connecting the anode and cathode of the PD and the TIA with each other; however, a technical concept as described above can be applied to the configurations of electrodes that connect the cathode-side and anode-side electrodes of the PD and the input-side electrodes of the TIA.

Figure 7:
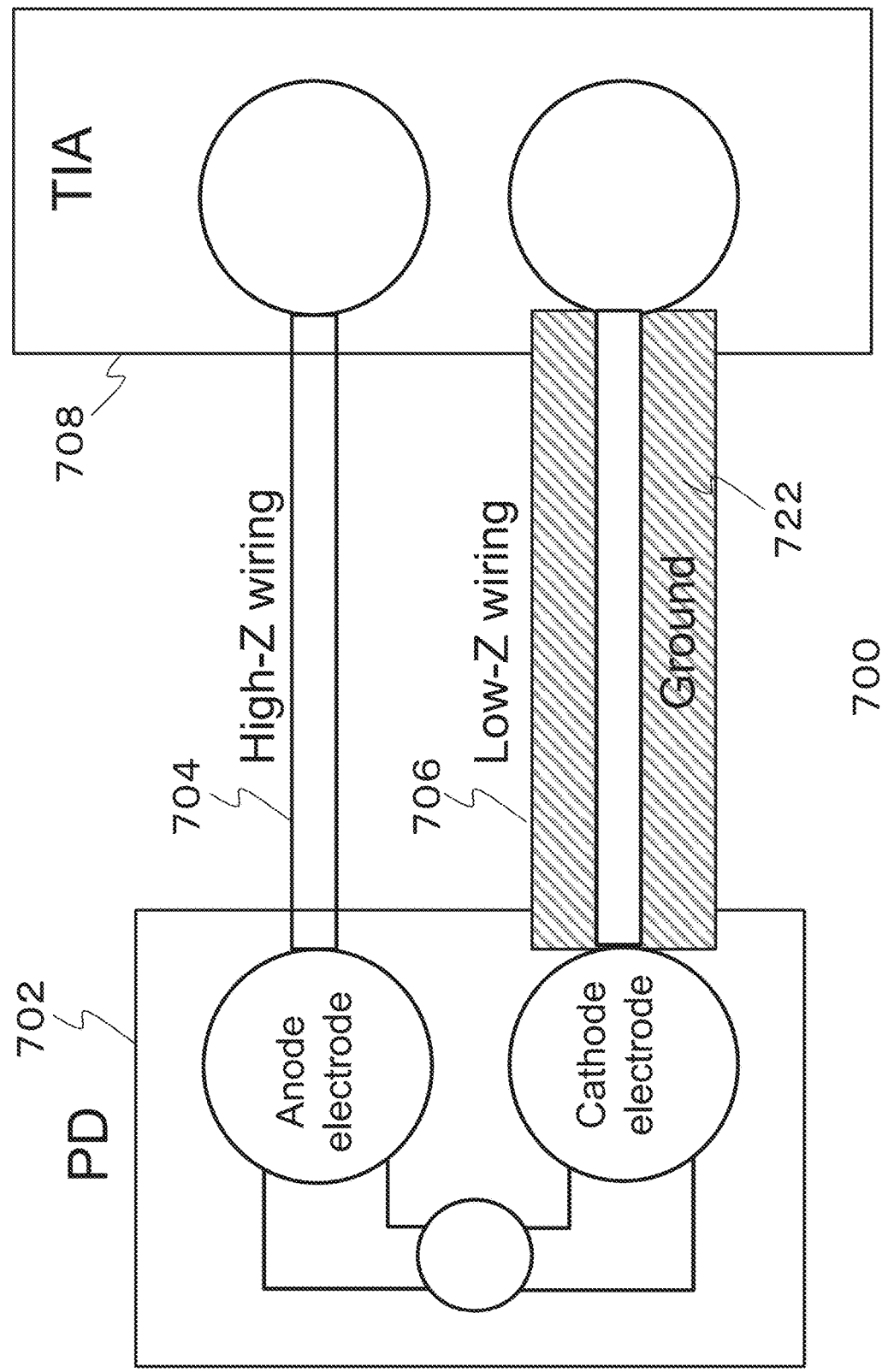
FIG. 7 is a schematic top view of an optical receiving circuit according to an embodiment of the present invention.

FIG. 7 is a schematic top view of an optical receiving circuit 700, that is configured as an optical integrated circuit, according to an embodiment of the present invention. In the embodiment, the optical integrated circuit may be configured in such a manner that a ground 722 is placed in a lower layer of a wiring between a cathode of a PD 702 and a TIA 708, whereas no ground is placed in a lower layer of a wiring between an anode of the PD 702 and the TIA 708. Also, in the embodiment of the present invention, the optical receiving circuit 700 may be formed on an Si substrate. A high-impedance wiring 704 and/or a low-impedance wiring 706 may be formed by use of a microstrip line and/or a coplanar waveguide. The ground 722 may be formed by use of an Si layer.

In an embodiment of the present invention, the optical receiving circuit may be formed on an SOI (Silicon on Insulator) substrate that has a structure comprising a silicon dioxide ($SiO_2$) layer interposed between an Si substrate and a surface Si layer (not shown in the drawing).

Figure 8:
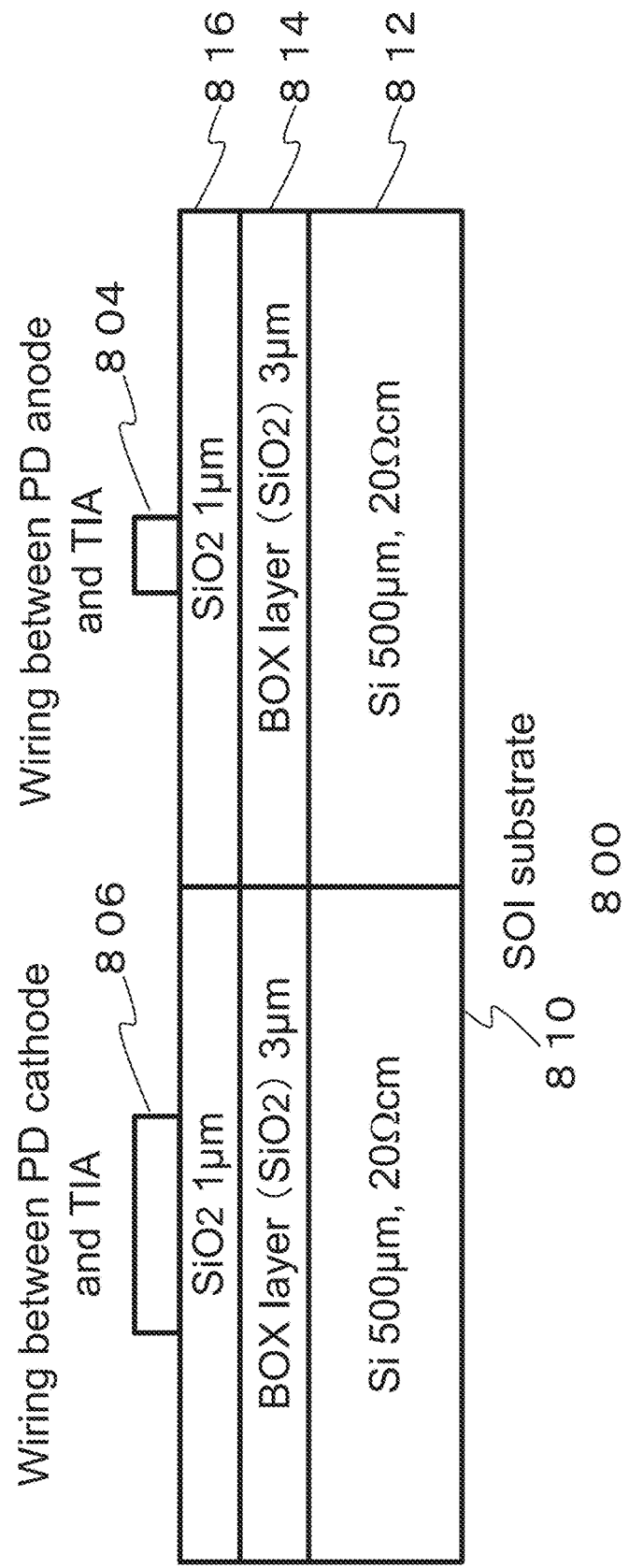
FIG. 8 is a schematic cross-section view of an optical receiving circuit according to an embodiment of the present invention.

FIG. 8 is a schematic cross-section view of an optical receiving circuit 800 according to an embodiment of the present invention, wherein a PD (not shown in the drawing) and a TIA (not shown in the drawing) are formed on an SOI substrate 810. In an SOI substrate, an $SiO_2$ layer is interposed between an Si substrate and a surface Si layer. The SOI substrate 810 may be formed by laminating an Si layer 812, a BOX (buried oxide) ($SiO_2$) layer 814, and an $SiO_2$ layer 816. As an example, the length of each of an anode-side wiring 804 and a cathode-side wiring 806 between the PD and the TIA may be set to be 500 μm. The Si layer 812 may be configured to have resistance of 20 Ωcm. The BOX layer 814 may be configured to have a thickness of 3 μm. The $SiO_2$ layer 816 may be configured to have a thickness of 1 μm. The anode-side wiring 804 and the cathode-side wiring 806 are formed on the SOT substrate 810, and the characteristic impedance of the anode-side wiring 804 is higher than that of the cathode-side wiring 806. For example, as shown in FIG. 8, the width of the anode-side wiring 804 may be set to be narrower than that of the cathode-side wiring 806.

Figure 9:
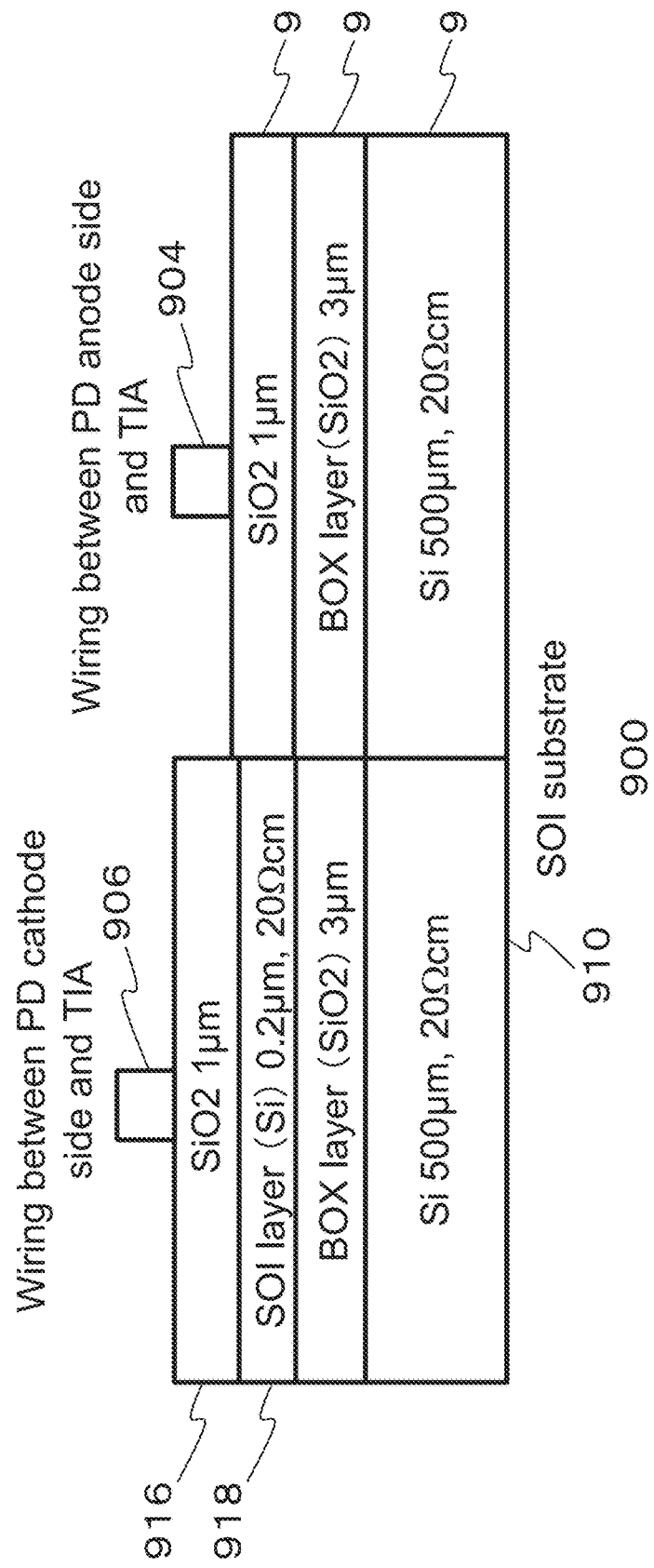
FIG. 9 is a schematic cross-section view of an optical receiving circuit according to an embodiment of the present invention.

FIG. 9 is a schematic cross-section view of an optical receiving circuit 900, that is formed on an SOT substrate 910, according to an embodiment of the present invention. The SOT substrate 910 comprises an Si layer 912, a BOX layer 914, and an $SiO_2$ layer 916. Further, an SOT (Si) layer 918 is formed between the BOX layer 914 and the $SiO_2$ layer 916 that are placed under a cathode-side wiring 906. According to the embodiment shown in FIG. 9, since the SOT layer 918 is conductive, a ground can be formed by the SOT layer. Thus, even in the case that the width of an anode-side wiring 904 and that of the cathode-side wiring 906 are similar to each other, a characteristic impedance of the anode-side wiring 904 becomes higher than a characteristic impedance of the cathode-side wiring 906.

In the embodiment shown in FIG. 9, in the SOT layer 918, carriers may be formed by selectively ion-implanting a part below the cathode-side wiring 906. In such a case, the part which is selectively ion-implanted has resistivity lower than the resistivity of other parts of the SOT layer 918 in which optical waveguides are formed. Thus, the characteristic impedance of the cathode-side wiring 906 further becomes lower, and the characteristic of the optical receiving circuit 900 is improved.

Figure 10:
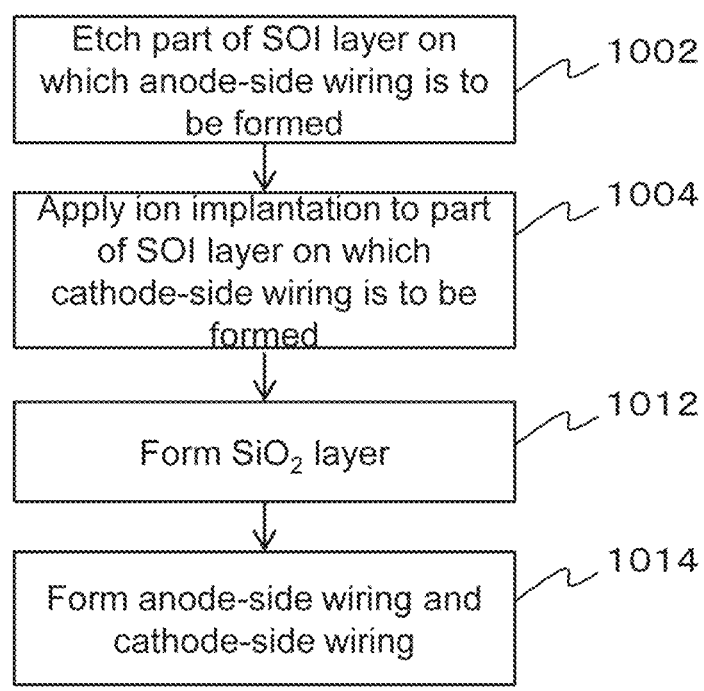
FIG. 10 is a flowchart showing a manufacturing process of an optical receiving circuit according to an embodiment of the present invention.

FIG. 10 is a flowchart showing a manufacturing process of the optical receiving circuit 900 shown in FIG. 9, according to an embodiment of the present invention. In step 1002, a part of an SOT layer, where a wiring between an anode of a photodiode and a transimpedance amplifier is to be formed, is etched. In step 1004, selective ion implantation is applied to the SOI layer under a part where a wiring between the cathode of the photodiode and the transimpedance amplifier is to be formed. In step 1012, an $SiO_2$ layer 916 is formed, on the SOI layer 918 on the cathode side and on the BOX layer 914 on the anode side. In step 1014, the anode-side wiring 904 and the cathode-side wiring 906 are formed on the $SiO_2$ layer 916. Optical components such as an Si modulator, a Ge photodetector, and so on may be formed in the SOI layer 918. In such a case, in addition to the selective ion implantation to a portion under the part in the SOI layer 918 where the cathode-side wiring 906 is to be formed, carrier injection may be applied to the parts where optical components are to be formed.

Figure 11:
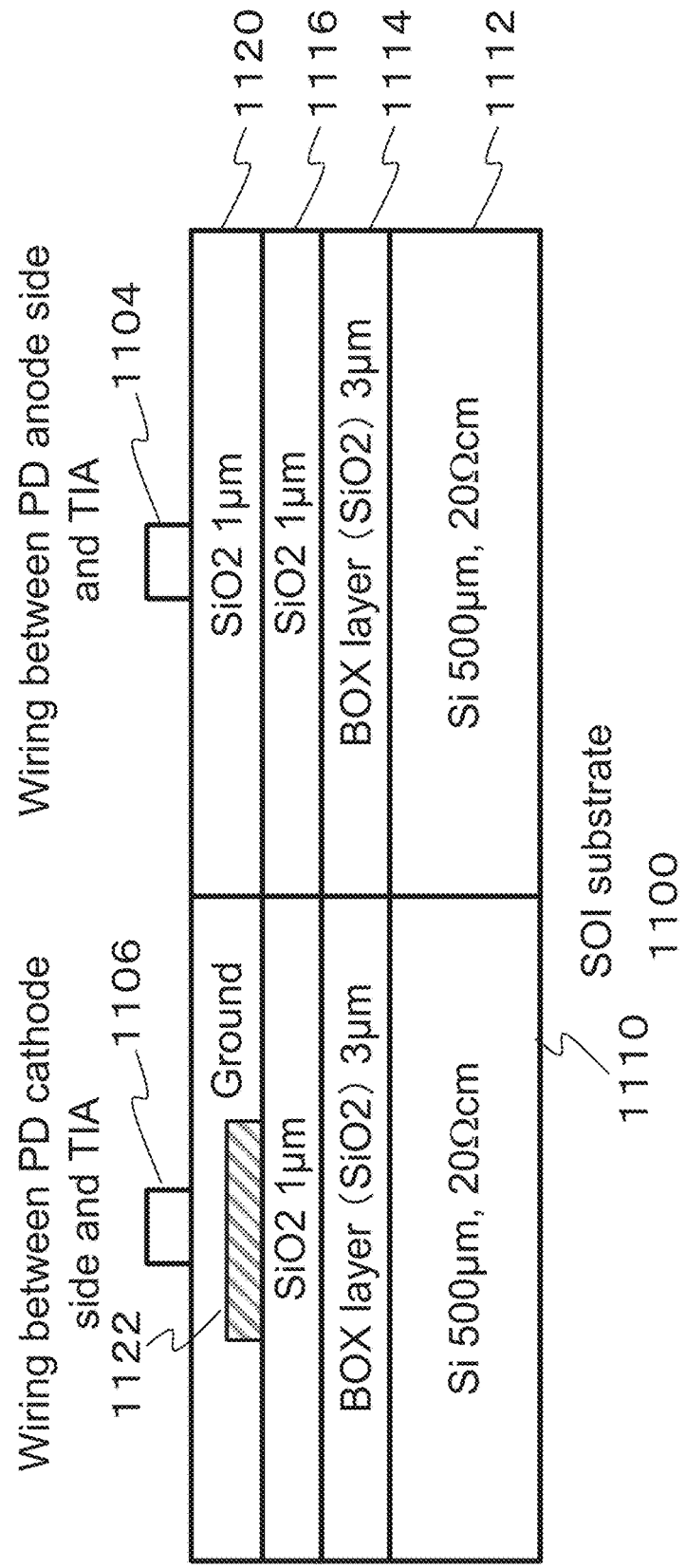
FIG. 11 is a schematic cross-section view of an optical receiving circuit according to an embodiment of the present invention.

FIG. 11 is a schematic cross-section view of an optical receiving circuit 1100, that is formed on an SOI substrate 1110, according to an embodiment of the present invention. The SOI substrate 1110 comprises an Si layer 1112, a BOX layer 1114, a first $SiO_2$ layer 1116, and a second $SiO_2$ layer 1120. Further, in the second $SiO_2$ layer 1120 on the cathode side, a ground 1122 is formed and a microstrip line is formed. According to the embodiment shown in FIG. 11, even if the width of the anode-side wiring 1104 and the width of the cathode-side wiring 1106 are similar, a characteristic impedance of the anode-side wiring 1104 becomes higher than a characteristic impedance of the cathode-side wiring 1106 since the ground 1122 is conductive.

Although the present invention is explained with reference to specific embodiments, it is intended that the embodiments described in this specification are not used to interpret the present invention in a limiting way, and that the embodiments described in this specification are used as examples to explain the present invention. It is obvious for a person skilled in the art that other alternative embodiments can be implemented without departing from the scope of the present invention.

The invention claimed is:

1. An optical receiving circuit comprising:
a photodiode; and
a transimpedance amplifier configured to supply an electrical power to the photodiode;
wherein a characteristic impedance of a wiring between an anode of the photodiode and the transimpedance amplifier is higher than a characteristic impedance of a wiring between a cathode of the photodiode and the transimpedance amplifier, and
wherein the photodiode and the transimpedance amplifier are formed on an SOI substrate, wherein the SOI substrate comprises an $SiO_2$ layer interposed between an Si substrate and a surface Si layer.

2. The optical receiving circuit according to claim 1, wherein the characteristic impedance of the wiring between the anode of the photodiode and the transimpedance amplifier is higher than an input impedance of the transimpedance amplifier.

3. The optical receiving circuit according to claim 1, wherein the characteristic impedance of the wiring between the cathode of the photodiode and the transimpedance amplifier is lower than an input impedance of the transimpedance amplifier.

4. The optical receiving circuit according to claim 1, wherein a ground is placed in a lower layer of the wiring between the cathode of the photodiode and the transimpedance amplifier, and no ground is placed in a lower layer of the wiring between the anode of the photodiode and the transimpedance amplifier.

5. The optical receiving circuit according to claim 1, wherein the ground placed in the lower layer of the wiring between the cathode of the photodiode and the transimpedance amplifier is formed by an SOI layer.

6. The optical receiving circuit according to claim 5, wherein a part of the SOI layer corresponding to the wiring between the cathode of the photodiode and the transimpedance amplifier is selectively ion implanted.

7. A method for manufacturing the optical receiving circuit according to claim 1, comprising:
   etching a part of an SOI layer where the wiring between the anode of the photodiode and the transimpedance amplifier is to be formed;
   ion-implanting a part on the SOI layer where the wiring between the cathode of the photodiode and the transimpedance amplifier is to be formed;
   forming the SiO$_2$ layer; and
   forming, on the SiO$_2$ layer, the wiring between the cathode of the photodiode and the transimpedance amplifier.

8. The method for manufacturing the optical receiving circuit according to claim 7, wherein the ion-implanting comprises carrying out carrier injection for forming an Si modulator or a Ge photodetector.

9. An optical receiving circuit comprising:
   a photodiode; and
   a transimpedance amplifier configured to supply an electrical power to the photodiode;
   wherein a characteristic impedance of a wiring between an anode of the photodiode and the transimpedance amplifier is higher than a characteristic impedance of a wiring between a cathode of the photodiode and the transimpedance amplifier, and
   wherein the photodiode and the transimpedance amplifier are formed on an Si substrate.

10. The optical receiving circuit according to claim 9, wherein the ground placed in the lower layer of the wiring between the cathode of the photodiode and the transimpedance amplifier is formed by an Si layer.

* * * * *